United States Patent [19]
Harkin et al.

[11] Patent Number: 5,705,413
[45] Date of Patent: Jan. 6, 1998

[54] METHOD OF MANUFACTURING AN ELECTRONIC DEVICE USING THERMALLY STABLE MASK

[75] Inventors: Gerard F. Harkin, London; Nigel D. Young, Redhill, both of England

[73] Assignee: U.S. Philips Corporation, New York, N.Y.

[21] Appl. No.: 728,242

[22] Filed: Oct. 8, 1996

[30] Foreign Application Priority Data

Oct. 12, 1995 [GB] United Kingdom ............. 9520901

[51] Int. Cl.$^6$ ........................................ H01L 21/786
[52] U.S. Cl. ............... 437/40 TFT; 437/41 TFT; 437/173; 437/19
[58] Field of Search ............... 437/40 TFT, 41 TFT, 437/173, 174, 19, 21, 229; 148/DIG. 150, DIG. 90, DIG. 91, DIG. 92, DIG. 93

[56] References Cited

U.S. PATENT DOCUMENTS

| | | | |
|---|---|---|---|
| 4,385,937 | 5/1983 | Ohmura | 437/19 |
| 4,561,906 | 12/1985 | Calder et al. | 437/19 |
| 4,619,034 | 10/1986 | Janning | 437/21 |
| 4,931,424 | 6/1990 | Henty | 437/19 |
| 4,933,298 | 6/1990 | Hasegawa | 437/173 |
| 5,130,829 | 7/1992 | Shannon | 359/59 |
| 5,382,537 | 1/1995 | Noguchi | 437/173 |
| 5,405,804 | 4/1995 | Yabe | 437/173 |

FOREIGN PATENT DOCUMENTS

| | | |
|---|---|---|
| 408129A2 | 1/1991 | European Pat. Off. . |
| 57-097619 | 6/1982 | Japan . |
| 61-49411 | 3/1986 | Japan ............. 437/174 |
| 62-036855 | 2/1987 | Japan . |
| A06104432 | 4/1994 | Japan . |
| A6151307 | 5/1994 | Japan . |

*Primary Examiner*—Michael Trinh
*Attorney, Agent, or Firm*—John C. Fox

[57] ABSTRACT

Thin-film circuit elements (M1,M2,M3,R) of a large-area electronic device such as an image sensor or flat panel display are formed with different crystallinity portions (1a, 1b) of a semiconductor film (1). Highly crystalline portions (1a) are formed by exposure to an energy beam (25), for example from an excimer laser, while amorphous or low-crystalline portions (1b) are masked by a masking pattern of thermally-stable absorbent or reflective inorganic material (21) on an insulating barrier layer (20). The barrier layer (20) of, for example, silicon oxide has a sufficient thickness ($t_b$) to mask the amorphous or low-crystallinity film portions (1b) from heating effects in the inorganic material, such as for example heat diffusion and/or impurity diffusion from the inorganic material (21). This type of masking pattern (20,21) in accordance with the invention is stable and versatile, permitting fabrication of interposed small-area components of different crystallinity in a thin-film circuit and capable of use for masking further processing treatments in earlier and/or later stages in the manufacture, for example an ion implantation (35).

17 Claims, 6 Drawing Sheets

METHOD OF MANUFACTURING AN ELECTRONIC DEVICE USING THERMALLY STABLE MASK

BACKGROUND OF THE INVENTION

This invention relates to methods of manufacturing electronic devices comprising thin-film circuitry, with a semiconductor film having a first portion of higher crystallinity than a second portion. The device may be a large area image sensor, or a flat panel display (for example a liquid crystal display), or several other types of large-area electronic device (for example a thin-film data store or memory device, or a thermal imaging device). The invention also relates to the devices manufactured by such methods.

There is currently much interest in developing thin-film circuits with thin-film transistors (hereinafter termed "TFT"s) and/or other semiconductor circuit elements on glass and on other inexpensive insulating substrates for large area electronics applications. Such TFTs fabricated with amorphous or polycrystalline semiconductor films may form the switching elements in a cell matrix, for example in a flat panel display as described in U.S. Pat. No. 5,130,829 (our reference PHB 33646), the whole contents of which are hereby incorporated herein as reference material.

Recent developments involve the fabrication and integration of thin-film circuits (often using polycrystalline silicon) as, for example, integrated drive circuits for such a cell matrix. In order to increase the circuit speed, it is advantageous to use semiconductor material of good crystal quality and high mobility for the thin-film bodies of the TFTs of these circuits. However, it is often desirable to form the TFTs of the matrix with semiconductor material of lower crystal quality, typically amorphous silicon or microcrystalline silicon, so that these matrix TFTs have only low leakage currents. Instead of needing to deposit two semiconductor films of different crystallinity, it is desirable to form the different crystallinities from a common film.

It is known from published Japanese Patent Application Kokai JP-A-06-104432 to manufacture TFTs from a common amorphous silicon film by exposing a first portion of the film to an energy beam (in the form of a pulsed laser beam) so as to crystallise the semiconductor material in this first portion, while retaining amorphous material in an unexposed second portion of the film. A very thin silicon oxide film (10 nm to 50 nm) is formed on the amorphous silicon film before exposing it to the energy beam, so as to protect the silicon film against the atmospheric environment. The crystallised first portion of the film is at a peripheral area of the substrate, where TFTs for an integrated drive circuit are then formed. The amorphous material is retained in the main central area of the substrate where the cell matrix is formed. Although this amorphous material is subjected to a subsequent anneal, it retains less crystalline properties than the laser crystallised material used for the drive circuit.

Various techniques are proposed for limiting the area exposed to the energy beam. In FIGS. 1A to 1D of JP-A-06-104432, the main central second portion of the film is masked from the energy beam by a photoresist masking pattern 106 formed thereon. In FIGS. 2A to 2D and 4A to 4D of JP-A-06-104432, the main central second portion of the film is masked from the energy beam by a stencil mask 207 held over the central portion of the substrate. In FIGS. 3A to 3D of JP-A-06-104432, the energy beam is directed only at the peripheral area of the substrate and there is no masking of the main central second portion of the film from the energy beam. The use of photolithography as in FIGS. 1A to 1D is needed when precision is required in defining the different circuit portions.

However, the present inventors find that none of the methods described in JP-A-06-104432 are suitable for precisely defining very small-area interposed first and second portions in the film, such as is desirable for interposing neighbouring circuit elements having higher-crystallinity material with circuit elements having lower-crystallinity material or amorphous material. Thus, for example, in a thin-film inverter circuit having a driver transistor coupled to a load element, it would be advantageous to form the driver transistor with a channel region in a said first portion of the higher crystallinity, and to form the load element with a said second portion of the lower (if any) crystallinity.

In work leading to the present invention, the present inventors have found that not even the photoresist precision masking technology illustrated in FIGS. 1A to 1D of JP-A-06-104432 is capable of defining such interposed circuit elements. Thus, for example, the present inventors find that the mask of photoresist organic material ablates and becomes distorted under exposure to the energy beam. Ablation of the photoresist by one pulse of the energy beam may remove so much photoresist material from an area of the masking pattern that subsequent pulses are not masked at that area. The ablated material may also re-deposit in undesirable areas of the substrate or for example on the window of the cell in which the exposure is effected. Distortion of the masking pattern (including melting and even burning of the photoresist) is aggravated by increasing the thickness of the photoresist.

It is an aim of the present invention to overcome or at least to mitigate these problems recognised by the present inventors and to provide a more versatile and stable masking pattern which may be used for multiple exposures to the energy beam and/or additionally for masking other processing in earlier or later stages in the manufacture, as described below.

SUMMARY OF THE INVENTION

According to the present invention there is provided a method of manufacturing an electronic device comprising thin-film circuitry with a semiconductor film having a first portion of higher crystallinity than a second portion, and including the stages of:

(a) depositing material for the semiconductor film on a substrate, (b) forming an insulating layer on the film, (c) forming a masking pattern on the insulating layer over the intended second portion of the film, (d) exposing the un-masked first portion of the film to an energy beam to crystallise the material in the first portion, while using the masking pattern to mask the second portion from the energy beam, and (e) forming thin-film circuit elements with the first and second portions of the film, characterised in that the masking pattern comprises thermally-stable inorganic material on the insulating layer, the insulating layer being a barrier layer of sufficient thickness to mask the second portion of the film from heating effects in the inorganic material when the second portion of the film is masked from the energy beam in stage (d), and the masking pattern being formed in stage (c) by steps which include:

(i) depositing the inorganic material on the barrier insulating layer on the film, (ii) using a photoresist pattern for defining the masking pattern in the inorganic material and in the barrier insulating layer by removal of the barrier insulating layer and the inorganic material from the first portion of the film; and (iii) removing the photoresist pattern before exposing the first portion of the film to the energy beam in stage (d).

In such a method in accordance the invention, the masking pattern for the energy beam comprises a thermally-stable inorganic material on an insulating barrier layer, and its pattern is defined using photoresist which is removed before the energy beam stage (d). Generally the thickness of this masking pattern is much thinner than the thickness of the photoresist pattern, and is typically of the same order of magnitude as the thickness of the semiconductor film. This use of these materials and thicknesses permits complicated and precisely-defined patterns to be formed in the masking pattern for the energy beam. Furthermore the use of these materials also provides a masking pattern which can have a high stability under the energy beam so that very complex crystallisation patterns can be formed in the semiconductor film. Thus, the present invention permits the fabrication of interposed neighbouring circuit elements having higher and lower (if any) crystallinity, for example for the driver transistor and a load element of an inverter. The high stability of the masking pattern permits it to be used for multiple exposures. Thus, it is now possible for the first portion of the film to be crystallised by exposure to multiple pulses of a pulsed laser beam in exposure stage (d), and for the inorganic material on the barrier insulating layer to be of the same pattern after exposure to the multiple pulses as it was at the start of the exposure stage (d). This composite masking pattern in accordance with the present invention is also sufficiently stable and versatile for use in masking earlier and/or later processing treatments as will be described below.

The thick barrier insulating layer has a particularly important role in masking the second portion of the film from heating effects in the inorganic material during the energy beam exposure stage (d). The barrier insulating layer is removed from the first portion of the film before exposing the first portion to the energy beam in stage (b). By this means, the barrier insulating layer is not present over the first portion of the film and so does not interfere with crystallisation of the first portion by the energy beam.

The barrier insulating layer may be of a variety of insulating materials already used in thin-film circuit technology, for example, silicon oxide and/or silicon nitride, and/or silicon oxy-nitride. Generally, the barrier insulating layer serves as a diffusion barrier against adverse effects of heat diffusion or impurity diffusion from the masking pattern of inorganic material. Thus, the barrier insulating layer may act as a thermal barrier to protect the second portion of the film from being heated to a crystallisation temperature when the masking pattern of inorganic material is heated by exposure to the energy beam in stage (d). The barrier insulating layer may act as a diffusion barrier to protect the second portion of the film from diffusion of impurities into the film portion from the masking pattern of inorganic material when the masking pattern is heated by exposure to the energy beam in stage (d).

A variety of thermally-stable inorganic materials may be used for the masking pattern, for example metals and semiconductor materials already used in thin-film circuitry. Thus, the inorganic masking pattern may be of metal which reflects the incident energy beam in stage (d) to mask the second portion of the film from the energy beam. Specific examples of suitable metals already used in thin-film circuit technology are chromium, tantalum, aluminium, tungsten, molybdenum, silver and titanium. With a reflective masking pattern care is needed in the design of the equipment so as to ensure that the reflected beam is not reflected back again by the equipment onto the semiconductor film, which may result in over exposure (and so over-heating) of some areas of the first portion(s) being crystallised. For this reason it is advantageous to avoid the use of reflective masking patterns and to maximise absorption of the incident beam in the masking pattern. This can be readily achieved when the inorganic masking pattern is of a semiconductor material which absorbs the incident energy beam. The semiconductor material of the masking pattern may be the same as that of the semiconductor film, so reducing risks of impurities being introduced into the semiconductor film from the masking pattern. However, a different semiconductor material may be used. Preferably this masking pattern of semiconductor material has a thickness larger than the absorption depth of the energy beam in the semiconductor material, so as to mask the underlying barrier insulating layer and second portion of the film from the energy beam in step (d).

After crystallising the first portion of the film in stage (d), an etching treatment may be used to etch away the pattern of inorganic material, and the barrier insulating material may act as an etch barrier to protect the second portion of the film against this etching treatment. Thus, the barrier insulating layer may perform different roles in different stages of the process. The inorganic material and the insulating barrier layer may both be removed in their entirety after stage (d), or parts of the inorganic pattern and/or insulating barrier layer may be retained in the manufactured device as, for example, respective conductive and insulating parts of one or more circuit elements of the device.

Methods in accordance with the present invention are particularly advantageous for forming neighbouring circuit elements having different crystallinity. Generally, the inorganic masking pattern formed in stage (c) has a thickness of the same order of magnitude as the semiconductor film, and such a pattern is particularly suitable for defining a plurality of interposed second and first portions in the film for interposing neighbouring circuit elements having different crystallinity. In present day thin-film circuitry, inverters are commonly used as basic building blocks of the circuit. The inverters may be used in digital form with approximately unity gain, or they may be used as amplifiers with very much higher gain. In order to reduce the size of the driver transistor of an inverter, it is advantageous to form the driver transistor in a film portion of higher crystallinity than the load element of the inverter. The present invention may be used for this purpose.

Thus, in a method in accordance with the present invention, the thin-film circuitry may comprise inverters each having a driver transistor coupled to a load, the driver transistor being formed with a channel region in a said first portion of the higher crystallinity, the load being formed with a said second portion of the lower (if any) crystallinity. The load element may be formed as a resistance element having its resistance path through said second portion of the lower (if any) crystallinity. In another form, the load element may be formed as a transistor having a channel region in said second portion of the lower (if any) crystallinity. Furthermore, in an inverter manufactured in accordance with the present invention, a bootstrap capacitor and associated switch may be formed coupled to a gate electrode of the transistor load element. The associated switch may be formed with a said second portion of the lower (if any) crystallinity, so as to have a lower leakage current than the circuit elements formed in film portions of the higher crystallinity.

The present invention therefore permits neighbouring circuit elements to be interposed with each other, having higher and lower mobility, higher and lower leakage currents, higher and lower resistance, and other characteristics dependent on the higher and lower crystallinity of the different film portions.

BRIEF DESCRIPTION OF THE DRAWINGS

These and other features in accordance with the present invention, and their advantages, are illustrated specifically in embodiments of the invention now to be described, by way of example, with reference to the accompanying diagrammatic drawings, in which:

FIGS. 1 to 6 are cross-sectional views of pad of an electronic device structure at successive stages in its manufacture by a method in accordance with the present invention, FIG. 5 illustrating the areas of four circuit elements of this device, whereas FIGS. 1 to 4 and FIG. 6 illustrate only two of these four areas;

Figure 3:
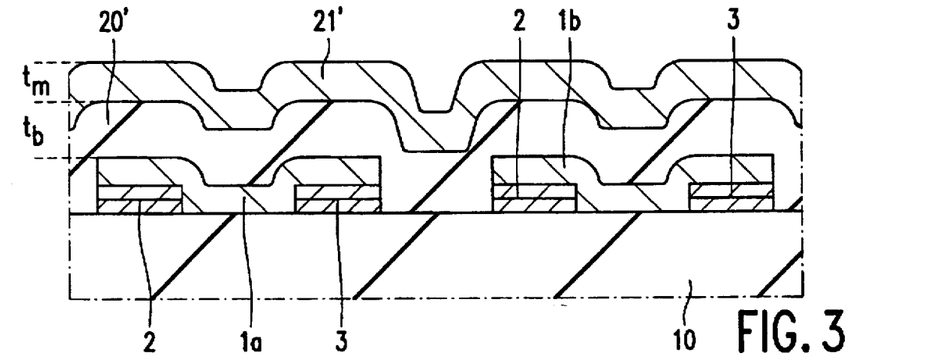
Figure 4:
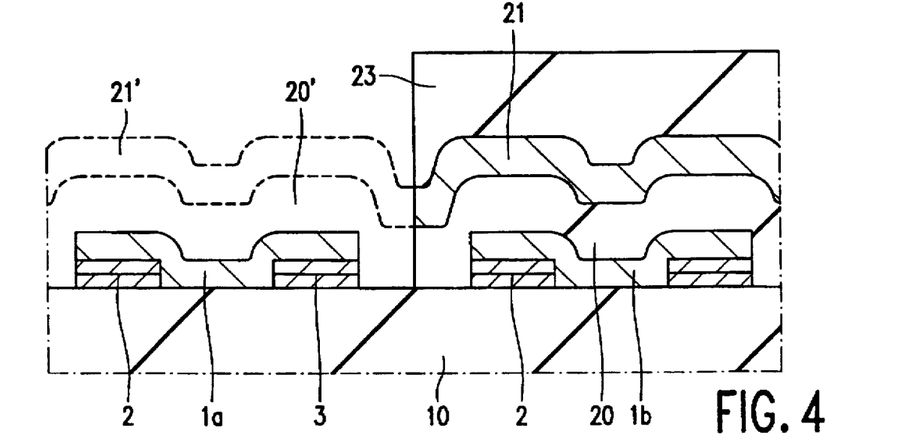
Figure 5:
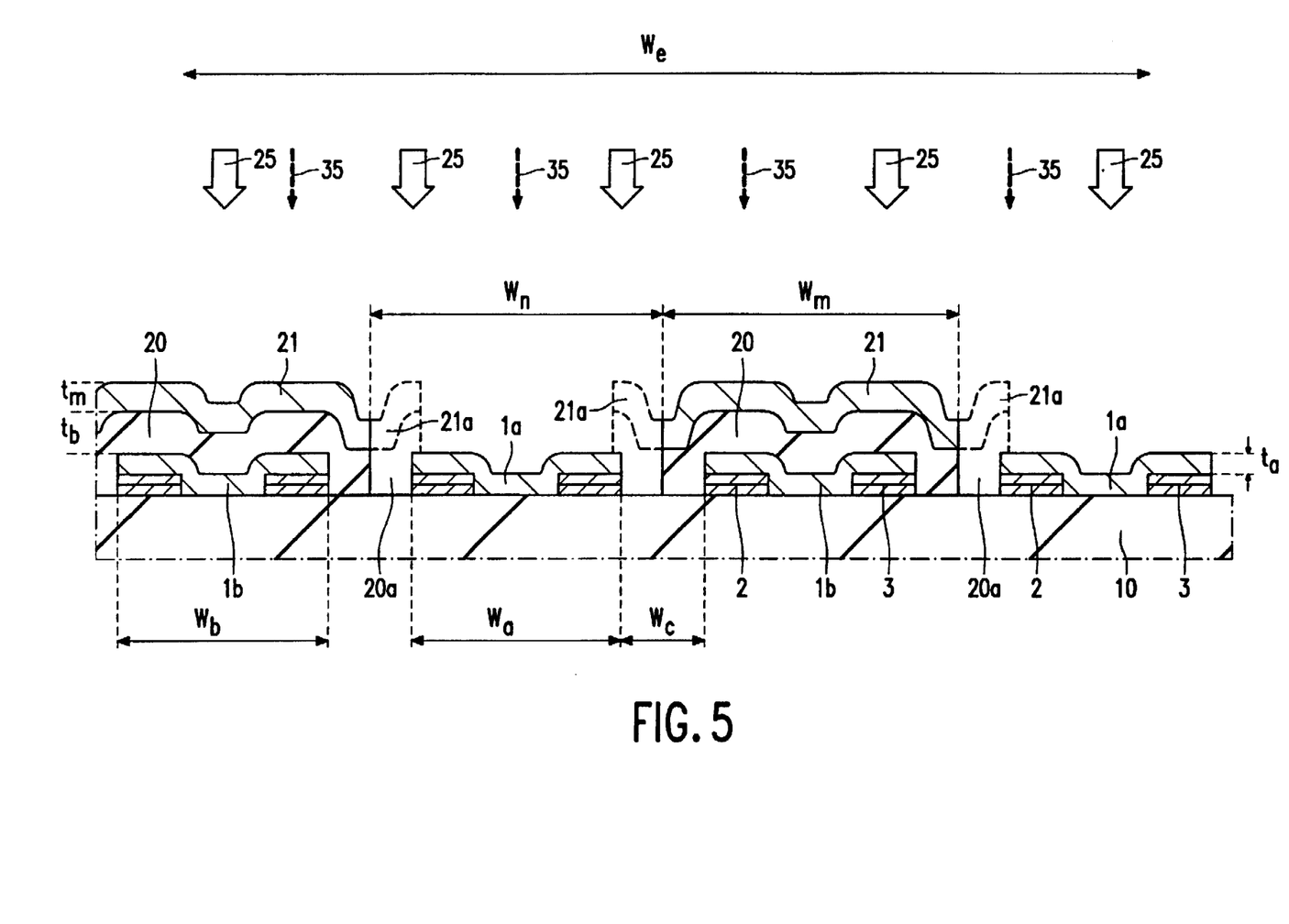

It should be understood that the cross-sectional views of FIGS. 1 to 6, 8, 9, 13 and 14 are diagrammatic and not drawn to scale. Relative dimensions and proportions of pads of these cross-sectional views have been shown exaggerated or reduced in size for the sake of clarity and convenience in the drawings. For the same reason only two of the four circuit element areas of FIG. 5 are shown in FIGS. 1 to 4 and FIG. 6. The same reference signs are generally used to refer to corresponding or similar features in the different embodiments.

DETAILED DESCRIPTION OF THE PREFERRED EMBODIMENTS

Figure 6:
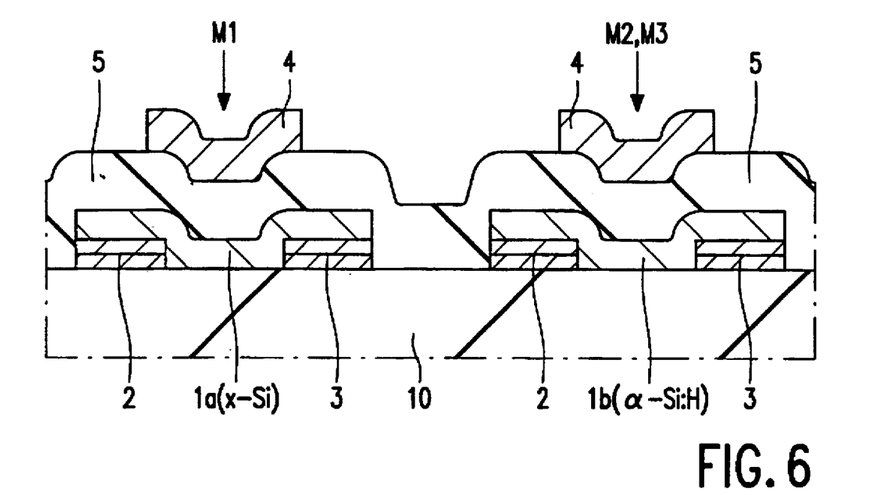

FIGS. 1 to 6 illustrate stages in the manufacture of a large-area electronic device comprising thin-film circuitry on an insulating substrate 10. The thin-film circuitry comprises a semiconductor film 1 having a first portion 1a of higher crystallinity than a second portion 1b (FIG. 6). The method includes the stages of:

(a) depositing material for the semiconductor film 1 on the substrate 10 (FIG. 2), (b) forming an insulating layer 20 on the film 1 (FIG. 3), (c) forming a masking pattern 21 on the insulating layer 20 over the intended second portion 1b of the film 1 (FIG. 4), (d) exposing the un-masked first portion 1a of the film 1 to an energy beam 25 to crystallise the material in the first portion 1a, while using the masking pattern 21 to mask the second portion 1b from the energy beam 25 (FIG. 5), and (e) forming thin-film circuit elements M1 and M2,M3 with the first and second portions 1a and 1b of the film 1.

In accordance with the present invention the masking pattern for the energy beam 25 comprises thermally-stable inorganic material 21 on an insulating barrier layer 20, the layer 20 being of sufficient thickness to mask the second portion 1b of the film 1 from heating effects in the inorganic masking pattern 21 when masking the second portion 1b of the film 1 from the energy beam 25 in stage (d). The composite masking pattern 20,21 is formed in stage (c) by steps which include:

(i) depositing the inorganic material to form a layer 21' on the barrier insulating layer 20' on the film 1 (FIG. 3), (ii) using a photoresist pattern 23 for defining the masking pattern 20,21 in the inorganic material and in the barrier insulating layer by removal of the barrier insulating layer 20' and the inorganic material 21' from the first portion 1a of the film (FIG. 4); and (iii) removing the photoresist pattern 23 before exposing the first portion 1a of the film 1 to the energy beam in stage (d), (FIG. 5).

Such a method in accordance with the present invention permits very small-area interposed first and second portions 1a and 1b of different crystallinity to be defined precisely in the semiconductor film 1 using the energy beam 25, so that neighbouring interposed circuit elements may have different crystallinity. Thus, for example, film portions 1a and 1b for individual circuit elements such as TFTs are typically semiconductor islands having lateral dimensions Wa and Wb (FIG. 5) of, for example, 30 $\mu m$ (micrometres) by 30 $\mu m$. The width Wc of the spacings between these individual islands 1a and 1b may be typically, for example 5 $\mu m$ to 10 $\mu m$. The lateral dimensions Wm of the masking pattern 21 covering the individual film portions 1b may be a few $\mu m$ wider, for example with dimensions of 36 $\mu m$ by 36 $\mu m$, and the width of the spacings Wn between these masking portions Wm may be typically as small as, for example, 36 $\mu m$ or less. The present invention permits these very small interposed areas to be formed with different crystallinity in the semiconductor film 1. Although FIG. 5 shows the energy beam 25 by several arrows, it should be understood that the energy beam 25 is normally a single beam which is scanned along the substrate 10. Typically, the width Wc of this single energy beam 25 may be the order $10^3$ $\mu m$, i.e. 1 cm.

Figure 2:
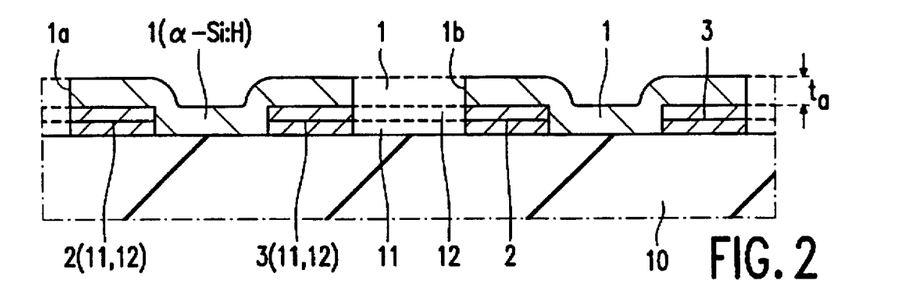

For the example illustrated in FIG. 5, areas of the film 1 were etched away to divide the film into separate island portions 1a and 1b before the energy beam exposure step (d). This prior island definition restricts crystal growth in the exposed film portions 1a to the pre-defined island portions 1a, so eliminating any possible crystal propagation through the film 1 into the masked areas 1b. The island definition may be effected using known photolithographic and etching techniques. FIG. 2 illustrates the island definition being effected before providing the masking pattern 21 and before even providing the insulating barrier layer 20. Where the present invention is used to form very small-area interposed circuit elements having different crystallinity, each pre-defined island 1a and 1b may form the individual body of a separate circuit element. Where groups of circuit elements have the same crystallinity, each circuit element of the group may have a separate individual body 1a or 1b formed at this prior island definition stage, or a larger pre-defined island 1a or 1b may be divided into the separate circuit elements bodies at a later stage after the energy beam exposure step (d).

A specific example of such an embodiment will now be described with reference to FIGS. 1 to 6. In this specific example, at least one of the circuit elements is a thin-film transistor of the so-called "staggered" type, having source and drain electrodes 2 and 3 at the substrate side of the semiconductor film 1, and an insulated gate 4 at the opposite, top side of the semiconductor film 1. Except for the masking and crystallisation stages illustrated in FIGS. 3 to 5, known silicon thin-film technology may be used to form these circuit elements. The nature of the substrate 10 on which the thin-film circuitry is formed depends on the type of electronic device being manufactured. Typically, the substrate 10 may be of a low-cost insulative material, for example a glass or a polymer material capable of withstanding the processing temperatures.

Figure 1:
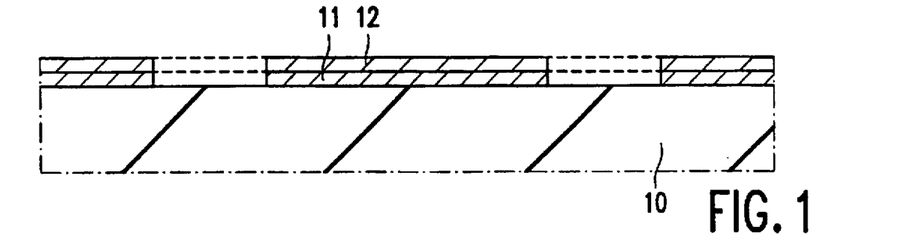

In the example shown in FIGS. 1 to 6, an electrode pattern 2,3 is first formed on the substrate 10 by depositing, for example, a metal film 11 and a highly doped semiconductive film 12. Typically, the metal film 11 may be of chromium having a thickness of, for example, 100 nm (nanometers). The semiconductive film 12 may be of phosphorus-doped silicon having a thickness of, for example, 100 nm. Parts of the films 11 and 12 are etched away as illustrated in FIG. 1, to define part of the electrode pattern 2,3, for example where the channel regions of the TFTs are to be formed.

The main body of the circuit elements is formed from a silicon film 1 which is deposited in known manner over the film pattern 11,12 of FIG. 1 on the substrate 10. The film 1 may be deposited as amorphous silicon material by a plasma-enhanced chemical vapour deposition (PECVD) process at a low temperature, for example between 100° C. and 300° C. Typically the resultant silicon film 1 has a hydrogen content, i.e. it is generally known as α-Si:H. It is also possible to deposit micro-crystalline silicon material (instead of amorphous silicon material) for the film 1 by using slightly higher temperatures. The thickness $t_a$ of the silicon film 1 is typically less than 0.1 μm, for example about 0.05 μm. The silicon film 1 may then be divided by etching in known manner into separate islands for each circuit element. The same photolithographic masking and etching stage may be used to fully define the bottom electrode pattern 2,3 on the substrate 10. The resulting device structure is illustrated in FIG. 2.

A thick insulating layer 20' is now deposited over the island structure on the substrate 10 so as to provide the insulating barrier layer which forms part of the masking pattern 20,21. The layer 20' may be of, for example, silicon oxide having a thickness $t_b$ of about 0.2 μm. It may be deposited in known manner, for example by PECVD. The thermally-stable inorganic masking material is then deposited as a layer 21' on the thick insulating layer 20', and its pattern is defined by a photolithographic and etching stage using a photoresist pattern 23. The etching treatment used to define the pattern in the inorganic masking layer 21 may also be used to remove the thick insulating layer 20' from over the portions 1a of the semiconductor film 1. This stage illustrated in FIG. 4 involves forming the photoresist pattern 23 on the inorganic material 21' over the second portion 1b of the film, etching away the inorganic material 21' where not covered by the photoresist pattern 23, and then etching away the barrier insulating layer 20' where not covered by the inorganic material 21.

The inorganic masking pattern 21 may be of material which is reflective to the energy beam 25 and/or absorbent of the energy beam 25. Preferably a pulsed excimer laser is used to produce the beam 25 for the crystallisation of the portions 1a of the silicon film 1. The masking pattern 21 may be of a metal (such as chromium, or tantalum, or aluminium, or tungsten, or molybdenum, or titanium) which is stable with this laser beam and which reflects the laser beam 25 from over the film portions 1b which are not to be crystal-lised. Chromium is both reflective and absorbent. In the case of a wholly absorbent masking pattern, the masking pattern 21 may be of, for example, amorphous silicon material having a thickness $t_m$ larger than the absorption depth of the laser beam in this material. Thus, for example, the masking pattern 21 may be of amorphous silicon having a thickness $t_m$ of about 0.1 μm. The resulting structure is illustrated in FIG. 4, before removal of the photoresist 23.

FIG. 5 illustrates the laser treatment stage used to crystallise the film portions 1a, while the film portions 1b are masked against the laser beam 25 by the pattern 21 on the barrier insulating layer 20. The pulsed laser beam 25 may be of an ultraviolet wavelength generated by an excimer laser. Thus, for example, a 248 nm wavelength from a pulsed KrF laser may be used, with an incident laser energy on the film portion 1a in the range of 100 to 300 mJ.cm$^{-1}$ per pulse. The pulse duration may be of the order of nanoseconds. Although a single pulse exposure could be used for crystallisation, the stability of the composite masking pattern 20,21 in accordance with the invention permits exposure to multiple pulses, for example, to 5 or to 10 such pulses.

As a result of the laser treatment illustrated in FIG. 5, the silicon material of the exposed portions 1a is converted to polycrystalline material, while that of the masked portions 1b remains as amorphous or microcrystalline material. The polycrystalline material of the portions 1a may typically have a crystal grain size of 0.1 to 0.3 μm. The electron field effect mobility through this polycrystalline material in n-channel TFTs may be typically, for example, in the range of 50 to 200 cm$^2$.V$^{-1}$.s$^{-1}$. During the exposure to this laser beam 25 the exposed silicon film portions 1a may be molten through most of their thickness.

Figure 7:
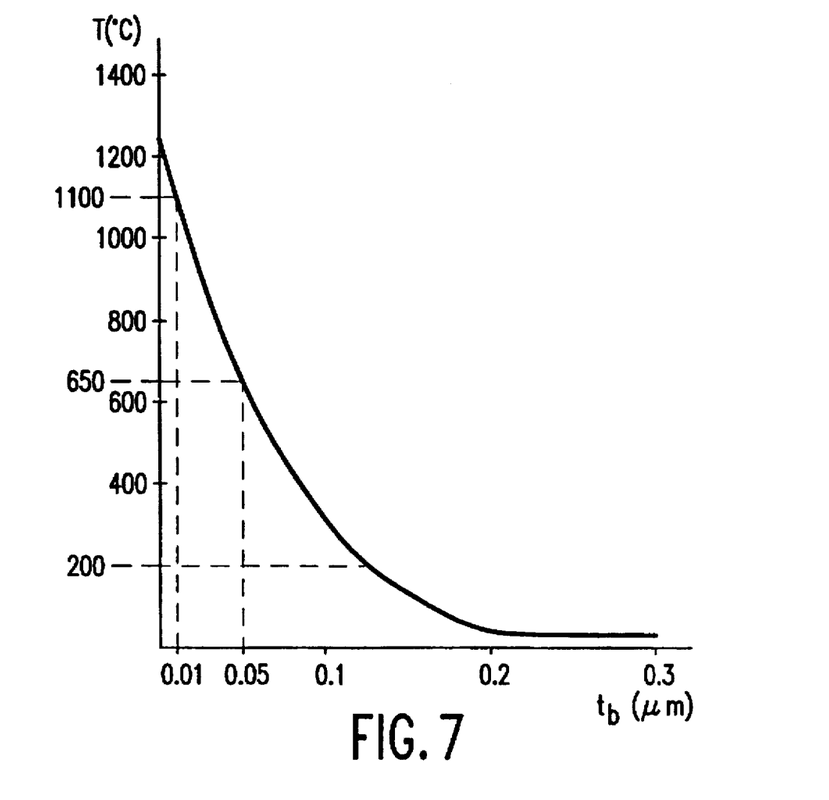
FIG. 7 is a graph of the silicon film temperature T in °C. (degrees Celsius) against the thickness $t_b$ in $\mu m$ (micrometres) of the barrier insulating layer during the energy beam exposure stage illustrated in FIG. 5.

Heating of the inorganic masking pattern 21 by the laser beam 25 occurs during this exposure to the laser beam 25. The thick insulating barrier layer 20 masks the film portion 1b from the heating effects of the laser beam 25 in the masking pattern 21. Thus, for example, in the case of a silicon masking pattern 21, the laser energy is absorbed in the silicon pattern 21 which may consequently become molten through part of its thickness. The molten silicon is at a temperature of approximately 1250° C. FIG. 7 shows the decrease in temperature across the thickness $t_b$ of an insulating barrier layer 20 of glassy silicon oxide, with pulses of 20 nanoseconds duration. As can be seen from FIG. 7, a thickness of 200 nm of silicon oxide reduces the temperature from above 1200° C. in the mask 21 to about the general ambient temperature, i.e. less than 50° C. This temperature in the masked film portion 1b is well-below the temperature at which crystallisation can occur in the film 1 and is even well below the temperature (for example about 200° C.) at which the film 1 was deposited. As a result, the masked film portion 1b not only remains uncrystallised but also unchanged in composition. Thus, for example, the hydrogen content with which it was deposited (as α-Si:H) is not driven off.

By comparison with the silicon oxide film on the surface of the crystallised and masked film portions in JP-A-06-104432, lines for an oxide film thickness of 0.01 μm and 0.05 μm are drawn in on FIG. 7. It can be seen from these lines that if such an oxide film were to be used as the only intermediate film below the silicon masking pattern 21 of the present invention, the temperature of the underlying film portion 1b would be in the range of 650° C. to 1100° C. Thus, crystallisation and compositional changes would occur in the film portion 1b under the silicon mask pattern 21 with such a thin-intermediate insulating film. Thus, the present invention provides a much thicker barrier insulating layer 20 to mask the underlying film portion 1b from the heating effects in the inorganic masking pattern 21. In the example illustrated in FIG. 7, the layer 20 needs a thickness $t_b$ in excess of 0.1 µm to keep the film temperature below 200° C., and in excess of 0.15 µm to keep the film temperature below 100° C.

The use of low temperature (e.g. about 150° C. and less) for depositing the film 1 and for its subsequent processing adjacent to the substrate 10 is particularly important when a polymer material is used for the substrate 10. In the case of a polymer substrate 10 it is also advantageous to mask the exposed substrate areas between the film islands 1a and 1b against exposure to the laser beam 25. The optional portions 20a and 21a in FIG. 5 illustrate a modification which will permit such masking. In this modification, after separating the first and second portions 1a and 1b by etching (FIG. 2), the masking pattern of the inorganic material 21 on the barrier insulating layer 2b is formed over the second portion 1b so as to extend with parts 21a,20a also over areas of the substrate 10 not covered by the first and second portions 1a and 1b, and serves to mask these areas of the substrate 10 during the energy beam exposure stage (d) of FIG. 5.

In the case of a reflective masking pattern 21 of, for example, chromium, some of the laser energy is still absorbed in the pattern 21 and so raises its temperature. Once again, the insulating barrier layer 20 acts as a thermal diffusion barrier between the masking pattern 21 and the underlying film portion 1b. In this case, however, the insulating barrier layer 20 also serves a more important role in preventing diffusion of the metal atoms from the heated pattern 21 to the underlying film portion 1b. Diffused atoms of chromium, (and of other reflective materials, e.g. tungsten, tantalum or aluminium) would constitute undesirable impurities in the silicon film 1b, in changing the electrical characteristics of the film 1b. The silicon oxide film 20 of, for example, 0.2 µm thickness provides an adequate impurity diffusion barrier. The impurity diffusion barrier aspect of the layer 20 is little importance when the masking pattern 21 is of the same material as the film pattern 1b.

After the laser crystallisation stage illustrated in FIG. 5, the masking patterns 21 and 20 may be removed from the silicon islands, and the silicon islands 1a and 1b are then further processed to form the desired thin-film circuit elements for the device. FIG. 6 illustrates part of a final device structure in which a high-mobility polycrystalline silicon thin-film transistor M1 has been formed with one of the crystallised silicon islands 1a providing the TFT channel region. Thus, an insulating layer 5 has been deposited to provide the gate dielectric film of this transistor, after which a metal film has been deposited and patterned to provide the gate electrode 4. A different circuit component is shown formed with an amorphous silicon island 1b in FIG. 6. This different component may be a low-leakage low-mobility amorphous silicon thin-film transistor M2 or M3, having a gate dielectric layer 5 and a gate electrode 4. The amorphous silicon film portion 1b provides the channel region of this transistor M2 or M3.

Although the fabrication of TFTs of the "staggered type" has been illustrated by way of example in FIGS. 1 to 6, it will be evident that other types of TFTs can be formed by modifications and variations of the process. Thus, for example, instead of forming the source and drain electrodes 2 and 3 on the substrate 10 below the silicon film 1, TFTs of the so-called "co-planar" type may be formed by providing the source and drain electrodes 2 and 3 on the silicon film portions 1a and 1b before depositing the gate dielectric 5 and gate electrode 4. TFTs of the so-called "inverted staggered type" may be formed by forming the gate electrode 4 and gate dielectric 5 on the substrate 10 before depositing the film 1, and then forming the source and drain electrodes 2 and 3 on the silicon film portions 1a and 1b. Instead of the source and drain electrodes comprising a highly doped layer 12 adjoining the silicon film 1, highly doped source and drain regions may be formed in the film portions 1a and 1b, for example by dopant ion implantation to form TFTs of the so-called "self-aligned" type.

The stable and versatile nature of the composite masking pattern 20,21 provided in accordance with the present invention also readily permits the manufacture of devices with different TFT types on the same substrate 10, as well as permitting the masking pattern 20,21 to be used in other processing stages. An example of such a modification is illustrated in FIG. 8 which relates to a stage after the laser crystallisation stage (d).

Figure 8:
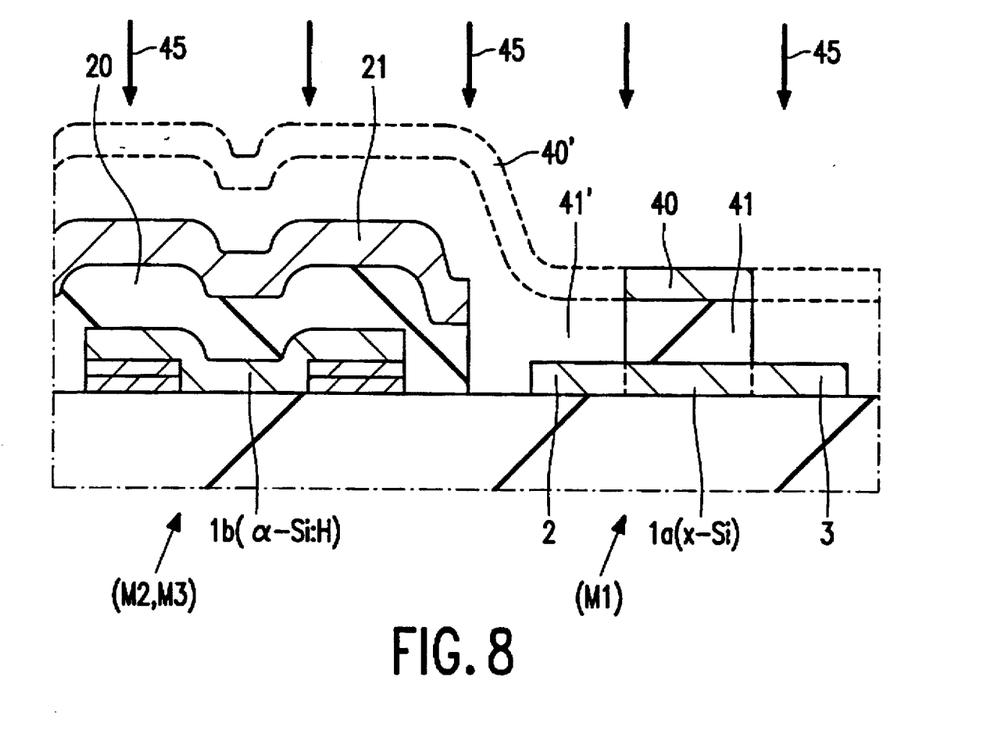
FIGS. 8, 9, 13 and 14 are cross-sectional means similar to FIGS. 1 to 6, illustrating modifications also in accordance with the invention.

In the FIG. 8 example the TFT M1 being formed in the crystallised film portion 1a is of the "self-aligned" type, whereas a TFT M2,M3 of the previously-illustrated "staggered" type is formed on the less-crystalline (or amorphous) island portion 1b. In this specific example, the composite masking pattern 20,21 is kept after the laser exposure stage (d) to provide two additional masking functions.

After crystallising the first portion 1a in the energy beam exposure stage (d), a gate dielectric layer 41 is deposited on the first portion 1a while the masking pattern 20,21 of the inorganic material on the barrier insulating layer is used to mask the second portion 1b of the film. A conductive layer 40' is deposited on the gate dielectric layer 41', and a photolithographic and etching stage is carried out in known manner to define an insulated gate structure 40,41 on the island portion 1a for the self-aligned TFT M1. During this photolithographic and etching stage, the masking pattern 21 acts as an etchant stop over the layer 20 on the island portion 1b.

The arrows 45 in FIG. 8 illustrate a later stage in the manufacture, in which the source and drain regions 2 and 3 of the "self-aligned" TFT are formed by dopant ion implantation. In this stage the dopant ions 45 are implanted in the first portion 1a while the masking pattern 20,21 of the inorganic material on the barrier insulating layer is used to mask the second portion 1b against the dopant ion implantation 45. Subsequently, a photolithographic and etching stage may be carried out to form an insulated gate structure from the conductive and insulating layers 21 and 20 of the masking pattern 20,21. When etching away parts of layer 21 to define the gate electrode, the layer 20 acts as an etch barrier to protect the island portion 1b.

In a further modification, after the laser exposure stage (d) and before the deposition of the layers 40' and 41' of FIG. 8, the composite masking pattern 20,21 may serve as an implantation mask during an implantation over the whole area of the crystallised island portion 1a. As described in published European patent application EP-A-0 408 129 (Our reference PHB 33571) such an implant of p-type dopant in a hydrogenated polycrystalline silicon n-channel TFT can serve to reduce leakage current. The whole contents of EP-A-0 408 129 are hereby incorporated herein as reference material. Such an implantation may also be carried out for the "staggered" polycrystalline silicon n-channel TFT being formed in the island 1a of FIGS. 1 to 6. Thus, this modification is illustrated by implantation arrows 35 in FIG. 5 and is carried out by transferring the substrate 10 of FIG. 5 to an ion implantation equipment after carrying out the laser crystallisation illustrated in FIG. 5.

Figure 9:
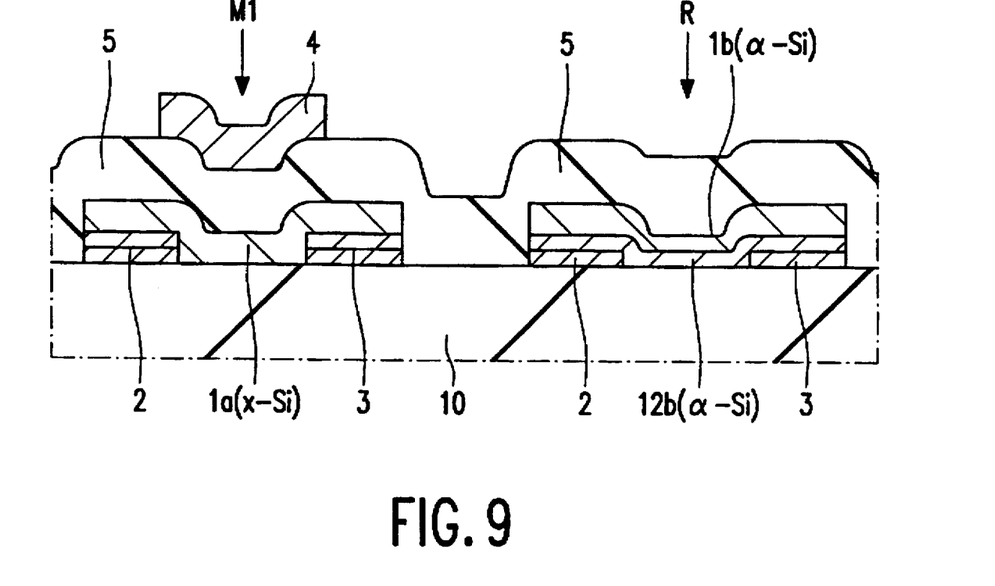

As well as or instead of TFTs, other types of component may be formed with the unmasked and masked film portions 1a and 1b. By way of example, FIG. 9 illustrates a resistor R formed in an amorphous silicon film portion 12b and 1b, which was masked against crystallisation by the masking pattern 20,21. In this case, the doped silicon film 12 forms a continuous conductive path between the metal electrodes 2 and 3 at opposite ends of the path. The resistive path of the resistor R is mostly in this amorphous film portion 12b, because of its higher conductance as compared with the amorphous undoped film portion 1b. Indeed, in this case the undoped film portion 1b could be omitted.

The present invention is particularly suitable for defining precisely very small area interposed first and second portions 1a and 1b of different crystallinity. Such portions 1a and 1b may be used to advantage in the inverter circuits illustrated in FIGS. 10 to 12. The inverters of FIGS. 10 to 12 each comprise a driver transistor M1 coupled to a load element R or M2. The driver transistor M1 is formed with its channel region in a first portion 1a of the higher crystallinity (for example, large-grain polycrystalline silicon), whereas the load element R or M2 is formed with the second portion of the lower crystallinity (for example, amorphous or microcrystalline or small grain polycrystalline silicon). Such a configuration permits the achievement of high gain from the inverter circuit, without requiring an excessive layout area for the driver transistor M1. Each inverter comprises first and second voltage supply lines 31 and 32 between which the driver transistor M1 and the load element are connected in known manner. The gate electrode 4 of the driver transistor M1 provides the input signal line I/P of the inverter. The output line is taken from the node 33 of the driver transistor M1 and the load element.

Figure 11:
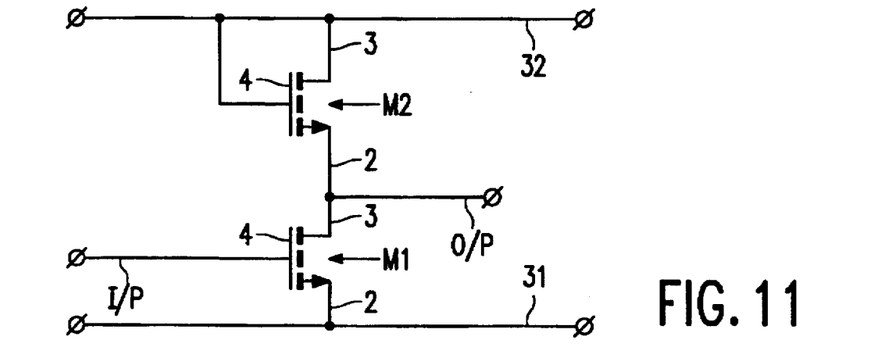

The load element in the inverter of FIG. 11 may be an amorphous silicon thin-film transistor M2, for example as illustrated in FIG. 6. Both the drain electrode 3 and gate electrode 4 of this transistor M2 are connected to the voltage supply line 32. It should be noted that the inverter of FIG. 11 is similar to an inverter disclosed in JP-A-06-151307, in which the driver transistor M1 has a higher conductance than the load transistor M2 as a result of a higher crystallinity of its channel region.

Figure 10:
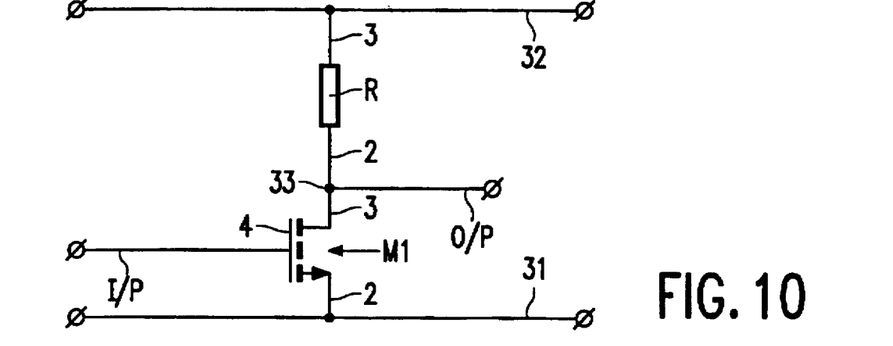
FIGS. 10, 11 and 12 are circuit diagrams of inverters comprising circuit elements having different film crystallinity formed using such methods in accordance with the present invention.

The load element in the inverter of FIG. 10 may be an amorphous silicon resistor R formed from an island portion 12b and/or 1b, for example as illustrated in FIG. 9. This inverter of FIG. 10 has several advantages as compared with the inverter of FIG. 11. Thus, there is no threshold voltage drop in the resistor R, so increasing the voltage swing at the output O/P from the voltage supply line 32. Because no gate electrode 4 is present in the resistor R, there is less capacitance, and so the inverter of FIG. 10 has a faster switching time. Above all, the use of an amorphous silicon portion 12b (1b) for the load R and a crystalline silicon portion 1a for the driver transistor M1 reduces the layout area required for the inverter of FIG. 10.

Figure 12:
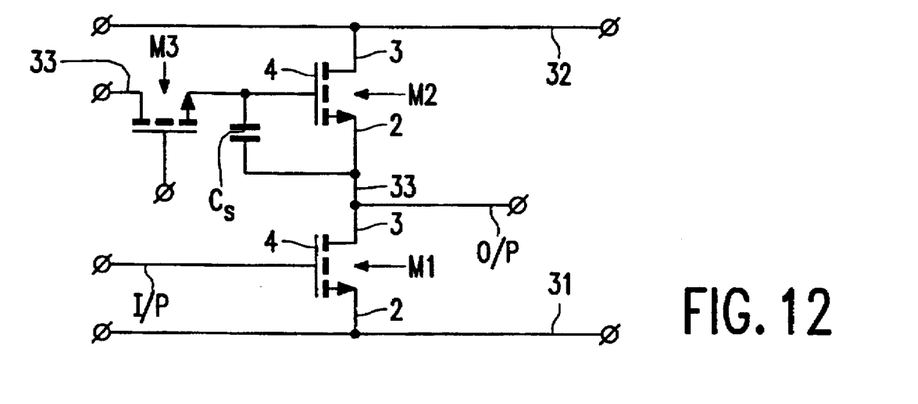

The load element of the inverter of FIG. 12 may comprise an amorphous silicon thin-film transistor M2 having a capacitor Cs connected between its gate electrode 4 and its source electrode 2. The capacitor Cs is periodically charged from a voltage supply line 33 via a switch M3. When the switch M3 is opened, the capacitor Cs holds the charge and acts to maintain the gate-source voltage of the load transistor M2 constant. With this charge-stage, the load transistor M2 is in its saturation region and so simulates a constant current source. This inverter of FIG. 12 may have a significantly higher gain than the inverter of FIG. 11.

An important requirement for the switch M3 of the inverter of FIG. 12 is that it should have a very low leakage. This can be achieved if the switch M3 is formed with an amorphous silicon island portion 1b. Thus, the switch M3 may be an amorphous silicon thin-film transistor M3 as illustrated in FIG. 6. However, instead of a thin-film transistor, the low-leakage switch M3 of FIG. 12 may be formed as a pair of low-leakage amorphous silicon diodes in non-crystallised film portions 1b.

The circuits of FIGS. 10 and 11 are particularly suitable for use as digital inverters, having a gain of approximately 1. The inverter of FIG. 12 is particularly suitable for forming an amplifier having a high gain. These inverter circuits may be used as the basic building blocks of integrated drive circuits of a large-area electronics device. The device may be a flat-panel display as described in the U.S. Pat. No. 5,130, 829. Such a device may comprise a thin-film array of, for example, switching TFTs each formed on the same substrate 10 as the drive circuit. These switching TFTs of the array may each comprise an un-crystallised film portion 1b forming a channel region of the transistor. The inverters formed with crystallised and uncrystallised portions 1a and 1b form part of the thin-film driving circuit for the thin-film array.

Instead of flat-panel display, the large area electronic device may be, for example, a large-area image sensor comprising a thin-film pixel array, each pixel comprising an amorphous silicon photodiode formed in an uncrystallised film portion 1b and at least one switching element which may also be formed in an uncrystallised film portion 1b. These amorphous silicon photodiodes may be of the so-called "α-Si:H PIN" type, having an undoped (intrinsic) film sandwiched between a p-type doped film and an n-type doped film, all of which films are of amorphous silicon containing hydrogen. The thin-film driving circuit comprising, for example, the inverters of FIGS. 10 to 12 may be formed with both crystallised and uncrystallised silicon film portions 1a and 1b.

It will be evident that many modifications and variations are possible within the scope of the present invention. In the embodiments described so far, the film portion 1b retains the same crystallinity (if any) as it had when deposited as the film 1 in FIG. 2. In embodiments where small-grain polycrystalline silicon is desired for the film portion 1b, the small-grain crystalline silicon may be formed by partially annealing the whole of the film 1 (i.e. without any mask pattern), either by heating the substrate 10 or scanning the film 1 with a low intensity laser beam, after which the masking pattern 20,21 is provided and the masked laser exposure is carried out to grow large-grain crystals in the film portion 1a.

FIG. 4 illustrates a photolitho-graphic and etching stage for the definition of the masking pattern 20,21 from the layers 20' and 21'. A photolithographic lift-off treatment may be used instead of etching. In this case, the photoresist pattern 23 is provided over the island portion 1a before depositing the layers 20' and 21'. After the deposition of layers 20' and 21', the photoresist pattern 23 is removed and lifts away the layer pads 20',21' thereon to leave the masking pattern 20,21 for the subsequent laser exposure stage (d), for example as in FIG. 5.

Figure 13:
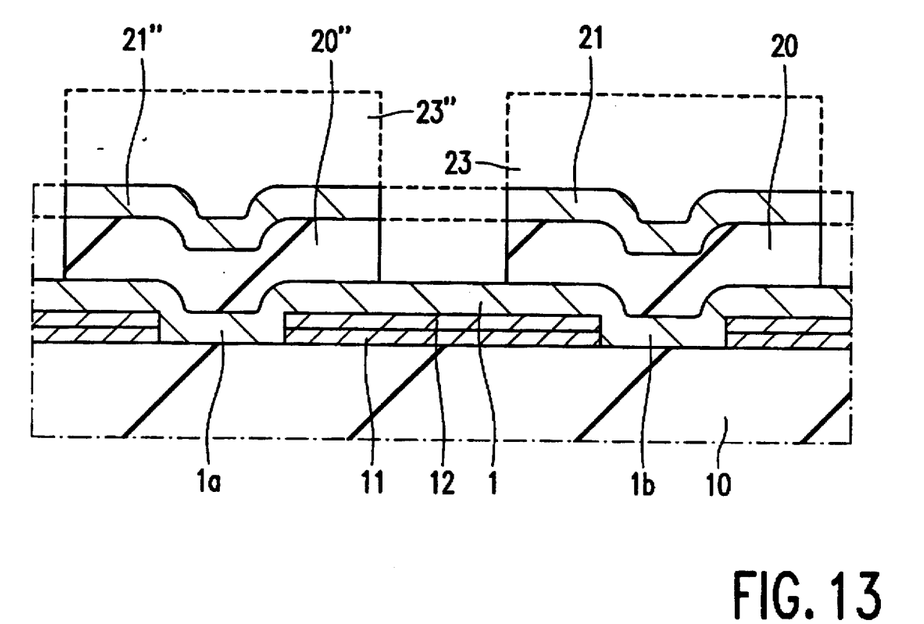
Figure 14:
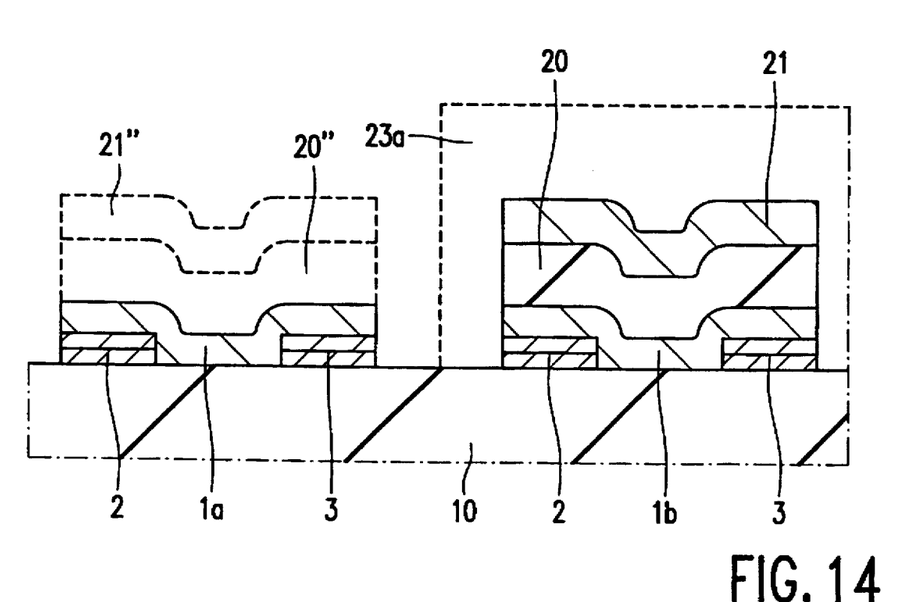

FIGS. 2 and 3 illustrate etch defining the island portions 1a and 1b before depositing the layers 20' and 21'. FIGS. 13 and 14 illustrate a modification in which a larger pattern 20,21,20",21" of the inorganic material on the barrier insulating layer is first formed as an etchant mask on the first and second portions 1a and 1b during the etching to separate the first and second portions (FIG. 13), after which the part 20",21" of this larger pattern present on the first portion 1a is removed (FIG. 14) to leave the masking pattern 20,21 of the inorganic material on the barrier insulating layer on the second portion 1b for the energy beam exposure stage (d). The larger pattern 20,21,20",21" is shown being defined in a photolithographic and etching stage with a photoresist etchant mask 23,23" in FIG. 13. After etching the film 1 to define the island portions 1a and 1b, a further photolithographic and etching stage is carried out with a photoresist etchant mask 23a (FIG. 14) to remove the layers 20" and 21" from the island portion 1a. The further photoresist mask 23a is itself removed before the energy beam exposure stage (d).

FIGS. 2 to 5 illustrate dividing the film 1 into the separate island portions 1a and 1b before exposure to the energy beam 25. However, the energy beam exposure stage (d) of FIG. 5 may be carried out on a continuous semiconductor film 1 (with masking pattern 20,21), and the island portions 1a and 1b may be separated by etching after this energy beam exposure stage (d).

In all the embodiments as described so far with reference to FIGS. 1 to 14, a laser was used to generate the energy beam 25. A laser beam 25 is particularly convenient for controlling the crystallisation and heating conditions. However, other forms of energy beam (for example an electron beam or high-power lamp radiation) may be used to fabricate the semiconductive crystalline material in the film portions 1a. Thus, the crystallisation of film portions 1a may be effected by a short-duration exposure to very high intensity lamps, while the masking pattern of the inorganic material 21 on the insulating barrier layer 20 masks the underlying film portions 1b.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component pads thereof, and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to such features and/or combinations of such features during the prosecution of the present Application or of any further Application derived therefrom.

We claim:

1. A method of manufacturing an electronic device comprising thin-film circuitry with a semiconductor film having a first portion of higher crystallinity than a second portion, and including the stages of:
    (a) depositing material for the semiconductor film on a substrate,
    (b) forming an insulating layer on the film,
    (c) forming a masking pattern on the insulating layer over the intended second portion of the film,
    (d) exposing the un-masked first portion of the film to an energy beam to crystallise the material in the first portion, while using the masking pattern to mask the second portion from the energy beam, and
    (e) forming thin-film circuit elements with the first and second portions of the film, characterised in that the masking pattern comprises thermally-stable inorganic material on the insulating layer, the insulating layer being a barrier layer of sufficient thickness to mask the second portion of the film from heating effects in the inorganic material when the second portion of the film is masked from the energy beam in stage (d), and the masking pattern being formed in stage (c) by steps which include:
    (i) depositing the inorganic material on the barrier insulating layer on the film,
    (ii) using a photoresist pattern for defining the masking pattern in the inorganic material and in the barrier insulating layer by removal of the barrier insulating layer and the inorganic material from the first portion of the film; and
    (iii) removing the photoresist pattern before exposing the first portion of the film to the energy beam in stage (d).

2. A method as claimed in claim 1, further characterised in that the thermally-stable inorganic material is of metal which reflects the incident energy beam in stage (d) to mask the second portion of the film from the energy beam.

3. A method as claimed in claim 1, further characterised in that the thermally-stable inorganic material is of a semiconductor material which absorbs the incident energy beam and has a thickness larger than the absorption depth of the energy beam in the semiconductor material, so as to mask the second portion of the film from the energy beam in step (d).

4. A method as claimed in claim 1, further characterised in that the barrier insulating layer acts as a thermal barrier to protect the second portion of the film from being heated to a crystallisation temperature when the thermally-stable inorganic material is heated by exposure to the energy beam in stage (d).

5. A method as claimed in claim 1, further characterised in that the barrier insulating layer acts as a diffusion barrier to protect the second portion of the film from diffusion of impurities from the thermally-stable inorganic material when the masking pattern is heated by exposure to the energy beam in stage (d).

6. A method as claimed in claim 1, further characterised in that the first portion of the film is crystallised by exposure to multiple pulses of a pulsed laser beam in exposure stage (d), and in that the inorganic material on the barrier insulating layer is of the same pattern after exposure to the multiple pulses as it was at the start of the exposure stage (d).

7. A method as claimed in claim 1, further characterised in that areas of the film are etched away to separate the first and second portions of the film before crystallising the first portion of the film in the energy beam exposure stage (d).

8. A method as claimed in claim 7, further characterised in that, after separating the first and second portions, the masking pattern of the inorganic material on the barrier insulating layer is formed over the second portion so as to extend also over areas of the substrate not covered by the first and second portions of the film and serves to mask these areas of the substrate during the energy beam exposure stage (d).

9. A method as claimed in claim 7, further characterised in that a larger pattern of the inorganic material on the barrier insulating layer is present as an etchant mask on the first and second portions of the film during the etching to separate the first and second portions, after which the part of this larger pattern present on the first portion is removed to leave the masking pattern of the inorganic material on the barrier insulating layer on the second portion for the energy beam exposure stage (d).

10. A method as claimed in claim 1, further characterised in that, after crystallising the first portion of the film in the energy beam exposure stage (d), dopant ions are implanted in the first portion of the film while the masking pattern of the inorganic material on the barrier insulating layer is used to mask the second portion against the dopant ion implantation.

11. A method as claimed in claim 1, further characterised in that, after crystallising the first portion of the film in the energy beam exposure stage (d), a gate dielectric layer is deposited on the first portion of the film while the masking pattern of the inorganic material on the barrier insulating layer is used to mask the second portion of the film.

12. A method as claimed in claim 1, further characterised in that the masking pattern is photolithographically defined in step (ii) by forming the photoresist pattern on the inorganic material over the second portion of the film, etching away the inorganic material where not covered by the photoresist pattern, and then etching away the barrier insulating layer where not covered by the inorganic material.

13. A method as claimed in claim 1, further characterised in that an etching treatment is used to etch away at least part of the masking pattern of inorganic material after crystallising the first portion of the film in stage (d), and in that the barrier insulating layer acts as an etch barrier to protect the second portion against this etching treatment.

14. A method as claimed in claim 1, further characterised in that the inorganic material deposited in stage (c) has a thickness of the same order of magnitude as the semiconductor film and defines a plurality of interposed second and first portions in the film for interposing neighbouring circuit elements having lower, if any, crystallinity with circuit elements having the higher crystallinity.

15. A method as claimed in claim 14, further characterised in that the thin-film circuitry comprises inverters each having a driver transistor coupled to a load element, the driver transistor being formed with a channel region in a said first portion of the higher crystallinity, the load element being formed with a said second portion of the lower, if any, crystallinity.

16. A method as claimed in claim 15, further characterised in that the load element is formed as a resistance element having its resistance path through said second portion of the lower, if any, crystallinity.

17. A method as claimed in claim 15, further characterised in that the load element is formed as a transistor having a channel region in said second portion of the lower, if any, crystallinity.

* * * * *